US011798630B2

(12) United States Patent
Carissimi et al.

(10) Patent No.: US 11,798,630 B2
(45) Date of Patent: Oct. 24, 2023

(54) MEMORY DEVICE

(71) Applicant: STMicroelectronics S.r.l., Agrate Brianza (IT)

(72) Inventors: Marcella Carissimi, Bergamo (IT); Fabio Enrico Carlo Disegni, Spino d'adda (IT); Chantal Auricchio, Milan (IT); Cesare Torti, Pavia (IT); Davide Manfre', Pandion (IT); Laura Capecchi, Vedano al Lambro (IT); Emanuela Calvetti, Villa d'Adda (IT); Stefano Zanchi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 7 days.

(21) Appl. No.: 17/407,903

(22) Filed: Aug. 20, 2021

(65) Prior Publication Data

US 2022/0068395 A1 Mar. 3, 2022

(30) Foreign Application Priority Data

Aug. 25, 2020 (IT) .................. 102020000020416

(51) Int. Cl.
*G11C 16/28* (2006.01)
*G11C 16/10* (2006.01)
(Continued)

(52) U.S. Cl.
CPC .............. *G11C 16/102* (2013.01); *G11C 7/04* (2013.01); *G11C 16/24* (2013.01); *G11C 16/28* (2013.01); *G11C 16/30* (2013.01)

(58) Field of Classification Search
CPC ......... G11C 16/102; G11C 7/04; G11C 16/24; G11C 16/28; G11C 16/30;
(Continued)

(56) References Cited

U.S. PATENT DOCUMENTS 9,508,446 B1 * 11/2016 Chen .................. G11C 16/0483
10,366,765 B2 7/2019 Chih et al.
(Continued)

FOREIGN PATENT DOCUMENTS

KR 1020170122459 A 11/2017

OTHER PUBLICATIONS

IT Search Report and Written Opinion for IT Appl. No. 102020000020416 dated May 6, 2021 (11 pages).

*Primary Examiner* — Khamdan N. Alrobaie
(74) *Attorney, Agent, or Firm* — CROWE & DUNLEVY

(57) ABSTRACT

A memory device includes programmable memory cells and a programming circuit for programming a selected memory cell to a target logic state by applying one or more programming current pulses. A temperature sensor operates to sense a temperature of the memory device. A reading circuit reads a current logic state of the selected memory cell after a predetermined programming current pulse of the programming current pulses. The reading circuit includes a sensing circuit that senses a current logic state of the selected memory cell according to a comparison between a reading electric current depending on the current logic state of the selected memory cell and a reference current. An adjusting circuit adjusts one or the other of the reading electric current and the reference electric current to be provided to the sensing circuit according to the temperature of the memory device.

11 Claims, 4 Drawing Sheets

(51) Int. Cl.
*G11C 7/04* (2006.01)
*G11C 16/24* (2006.01)
*G11C 16/30* (2006.01)

(58) Field of Classification Search
CPC .............. G11C 2207/063; G11C 7/062; G11C 2013/0054; G11C 13/0004; G11C 13/0064; G11C 11/1677
See application file for complete search history.

(56) References Cited

U.S. PATENT DOCUMENTS

| | | | |
|---|---|---|---|
| 2010/0290280 A1* | 11/2010 | Seo | G11C 7/062 365/171 |
| 2011/0080775 A1* | 4/2011 | Bae | G11C 13/004 365/210.1 |
| 2015/0092470 A1* | 4/2015 | Vimercati | G11C 7/14 365/163 |
| 2020/0111529 A1* | 4/2020 | Shin | G11C 16/28 |

* cited by examiner

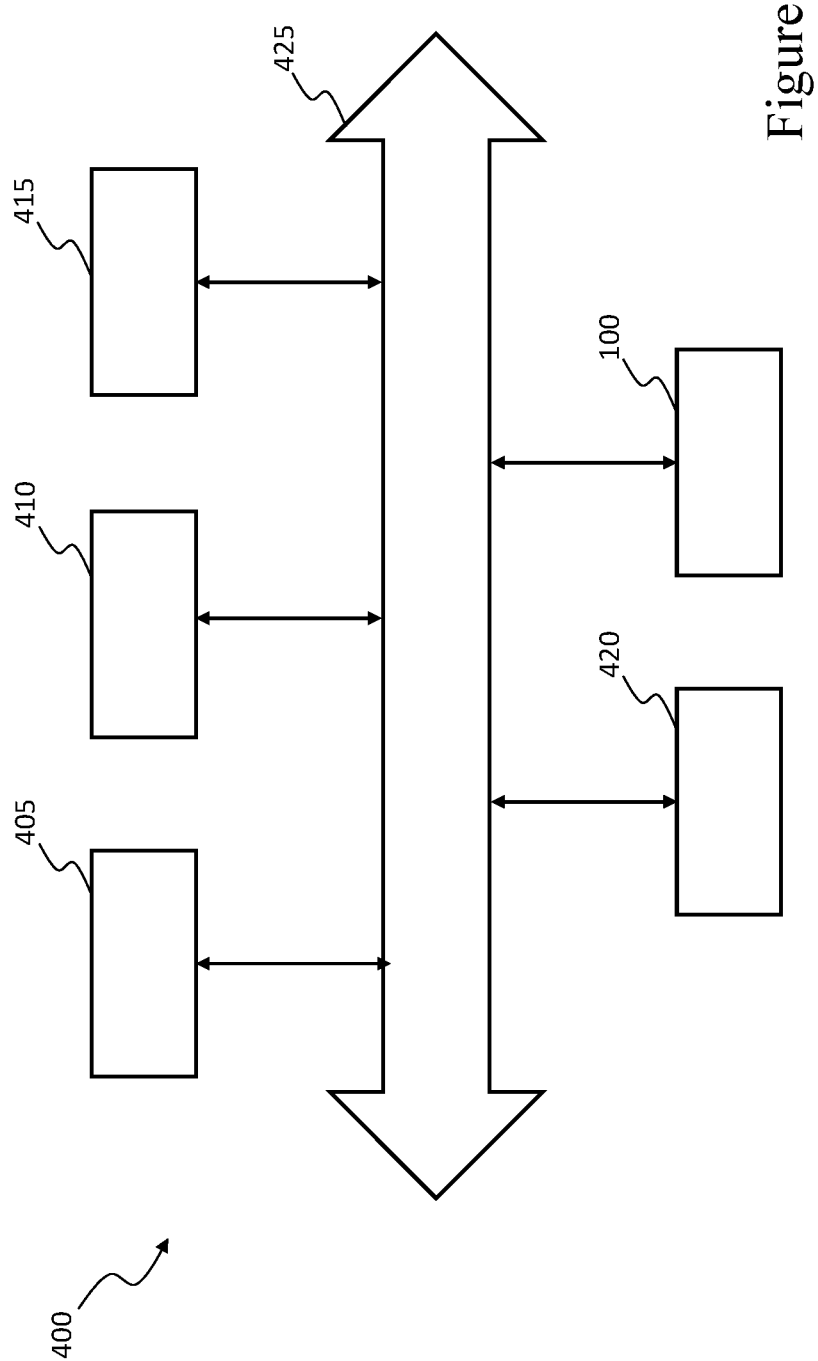

MEMORY DEVICE

PRIORITY CLAIM

This application claims the priority benefit of Italian Application for Patent No. 102020000020416, filed on Aug. 25, 2020, the content of which is hereby incorporated by reference in its entirety to the maximum extent allowable by law.

TECHNICAL FIELD

Embodiments herein generally relate to the field of memory devices. Particularly, the embodiments herein relate to non-volatile random-access memory devices. More particularly, the embodiments herein relate to memory devices comprising memory cells programmable to store each one a logic state according to a respective programming electric current flowing through the memory cell, such as "Phase Change Memory" (PCM) memory cells, "Spin Torque Magnetoresistive Random Access Memory Cells" (ST-MRAM) memory cells and "Resistive Random Access Memory Cells" (RRAM) memory cells.

BACKGROUND

Memory devices based on PCM memory cells, ST-MRAM memory cells and RRAM memory cells are increasingly widespread.

Considering, just as an example, a memory device based on PCM memory cells (also referred to as PCM memory device), each PCM memory cell is configured to store data using phase change materials (such as chalcogenide) capable of stably transitioning between amorphous and crystalline phases according to an amount of heat transferred thereto (wherein the amount of heat is determined by the programming electric current applied to the PCM memory cell). The amorphous and crystalline phases exhibit different resistance values, which are used to distinguish different logic states of the PCM memory cells: particularly, the amorphous phase exhibits a relatively high resistance, and the crystalline phase exhibits a relatively low resistance.

Typically, the amorphous phase is used to represent a logic state "0" (usually referred to as RESET state), and the crystalline phase is used to represent a logic state "1" (usually referred to as SET state).

A typical PCM memory device comprises a programming circuit for programming a selected PCM memory cell to a desired or target logic state (e.g., the SET state or the RESET state).

The programming circuit is typically configured to program the selected PCM memory cell by applying to the selected PCM memory cell a corresponding programming electric current: the programming electric current typically comprises one or more a succession of programming current pulses for programming the selected PCM memory cell to the SET state, or a succession of programming current pulses for programming the selected PCM memory cell to the RESET state.

The PCM memory device is typically configured to implement, during a programming operation of a selected PCM memory cell, a verify operation intended to verify a progress of the programming operation. According to verify operation principles, after a predetermined programming current pulse (such as a first programming current pulse or a last programming current pulse) of the succession of programming current pulses is applied to the selected PCM memory cell, the PCM memory device is configured to read a current logic state of the selected PCM memory cell.

The PCM memory device typically comprises a sensing circuit configured to sense the current logic state of the selected PCM memory cell according to a comparison between a reading electric current (i.e., the electric current flowing through the selected PCM memory cell) and a reference electric current, the reference electric current being set at a value depending on the target logic state and on the corresponding predetermined programming current pulse (e.g., the first programming current pulse or the last programming current pulse).

It is understood by those skilled in the art that the known PCM memory device exhibits criticalities during verify operations.

Indeed, the reading electric current of a PCM memory cells exhibits variations with temperature, bit line voltage and time elapsed from the application of the predetermined programming current pulse and the start of the verify operation.

Since the verify operation has to be performed immediately after the application of the predetermined programming current pulse, so as to end the programming operation within a prescribed time, and since the sensing circuit is typically designed to optimally discriminate the logic state of a PCM memory cell only in a given electric current range, such a variability of the reading electric current may result in non-negligible errors during the verify operation, and particularly in the failure to sense the current logic state of the PCM memory cell by the sensing circuit.

SUMMARY

To address the above-mentioned issues, a memory device comprises an adjusting circuit configured to adjust at least one between the reading electric current and the reference electric current to be provided to the sensing circuit according to a temperature of the memory device.

More specifically, an embodiment relates to a memory device. The memory device may comprise a plurality of programmable memory cells. The memory device may comprise a programming circuit for programming a selected memory cell of the plurality of memory cells to a target logic state by applying one or more programming current pulses to the selected memory cell. The memory device may comprise a temperature sensor for sensing a temperature of the memory device. The memory device may comprise a reading circuit for reading a current logic state of the selected memory cell after a predetermined programming current pulse of the programming current pulses. The reading circuit may comprise a sensing circuit configured to sense a current logic state of the selected memory cell according to a comparison between a reading electric current depending on the current logic state of the selected memory cell and a reference current. The reading circuit may comprise an adjusting circuit configured to adjust at least one between the reading electric current and the reference electric current to be provided to the sensing circuit according to the temperature of the memory device.

According to an embodiment, whose features are additional or alternative to any of the features of the previous embodiments, the predetermined programming current pulse comprises at least one between a first programming current pulse of the programming current pulses and a last programming current pulse of the programming current pulses.

According to an embodiment, whose features are additional or alternative to any of the features of the previous embodiments, the adjusting circuit is configured to provide an adjusted reference electric current being adjusted with respect to the reference electric current according to the temperature of the memory device. The reading circuit may comprise a bit line through which the reading electric current flows. The reading circuit may comprise a reference bit line through which the reference electric current flows. The reading circuit may comprise a further reference bit line associated with the reference bit line. The adjusting circuit may be configured to provide to the further reference bit line a further reference electric current depending on the temperature of the memory device. The adjusted reference electric current may comprise said reference electric current and said further reference electric current.

According to an embodiment, whose features are additional or alternative to any of the features of the previous embodiments, the adjusting circuit is configured to select the further reference electric current from among a plurality of further reference currents, wherein each further reference current is associated with a respective temperature range. The adjusting circuit may be configured to provide the further reference electric current associated with the temperature range within which the temperature of the memory device falls.

According to an embodiment, whose features are additional or alternative to any of the features of the previous embodiments, the sensing circuit is configured to sense the current logic state of the selected memory cell according to a comparison between the adjusted reference electric current and the reading electric current.

According to an embodiment, whose features are additional or alternative to any of the features of the previous embodiments, the adjusting circuit is configured to provide an adjusted reading electric current being adjusted with respect to the reading electric current according to the temperature of the memory device. The reading circuit may comprise a bit line through which the reading electric current flows. The adjusting circuit may be configured to bias the bit line with an adjusted biasing electric voltage being adjusted with respect to a predefined biasing electric voltage according to the temperature of the memory device. The adjusted reading electric current may be adjusted with respect to the reading electric current according to said adjusted biasing electric voltage.

According to an embodiment, whose features are additional or alternative to any of the features of the previous embodiments, the adjusting circuit comprises a variable resistor and a circuit arrangement configured to cause a predefined electric current to flow through the variable resistor. The predefined biasing electric voltage may depend on a predefined resistance value of the variable resistor and on the predefined electric current flowing therethrough. The adjusting circuit may be configured to adjust the resistance value of the variable resistor according to the temperature of the memory device. The adjusted biasing electric voltage may depend on the adjusted resistance value of the variable resistor and on the predefined electric current flowing therethrough.

According to an embodiment, whose features are additional or alternative to any of the features of the previous embodiments, the sensing circuit is configured to sense the current logic state of the selected memory cell according to a comparison between the adjusted reading electric current and the reference electric current.

According to an embodiment, whose features are additional or alternative to any of the features of the previous embodiments, the memory cells comprise one of phase-change memory cells, spin torque magnetoresistive random access memory cells, or resistive random-access memory cells.

Another aspect of the embodiments relates to an electronic system comprising such a memory device, or more thereof.

A further aspect of the embodiments relates to a method for operating a memory device. The method may comprise programming a selected memory cell of a plurality of memory cells to a target logic state by applying one or more programming current pulses to the selected memory cell. The method may comprise sensing a temperature of the memory device. The method may comprise reading a current logic state of the selected memory cell after a predetermined programming current pulse of the programming current pulses. Said reading may comprise sensing, at a sensing circuit of the memory device, a current logic state of the selected memory cell according to a comparison between a reading electric current depending on the current logic state of the selected memory cell and a reference current. Said reading may further comprise adjusting at least one between the reading electric current and the reference electric current to be provided to the sensing circuit according to the temperature of the memory device.

One or more aspects of the embodiments are set out in the independent claims, with advantageous features of the same invention that are indicated in the dependent claims, whose wording is enclosed herein verbatim by reference (with any advantageous feature being provided with reference to a specific aspect of the embodiments that applies mutatis mutandis to any other aspect).

BRIEF DESCRIPTION OF THE DRAWINGS

These and other features and advantages of the embodiments will be made apparent by the following description of some exemplary and non-limitative embodiments thereof. For its better intelligibility, the following description should be read making reference to the attached drawings, wherein:

FIG. 4 shows a simplified block diagram of an electronic system comprising the memory device of FIG. 1.

DETAILED DESCRIPTION

Figure 1:
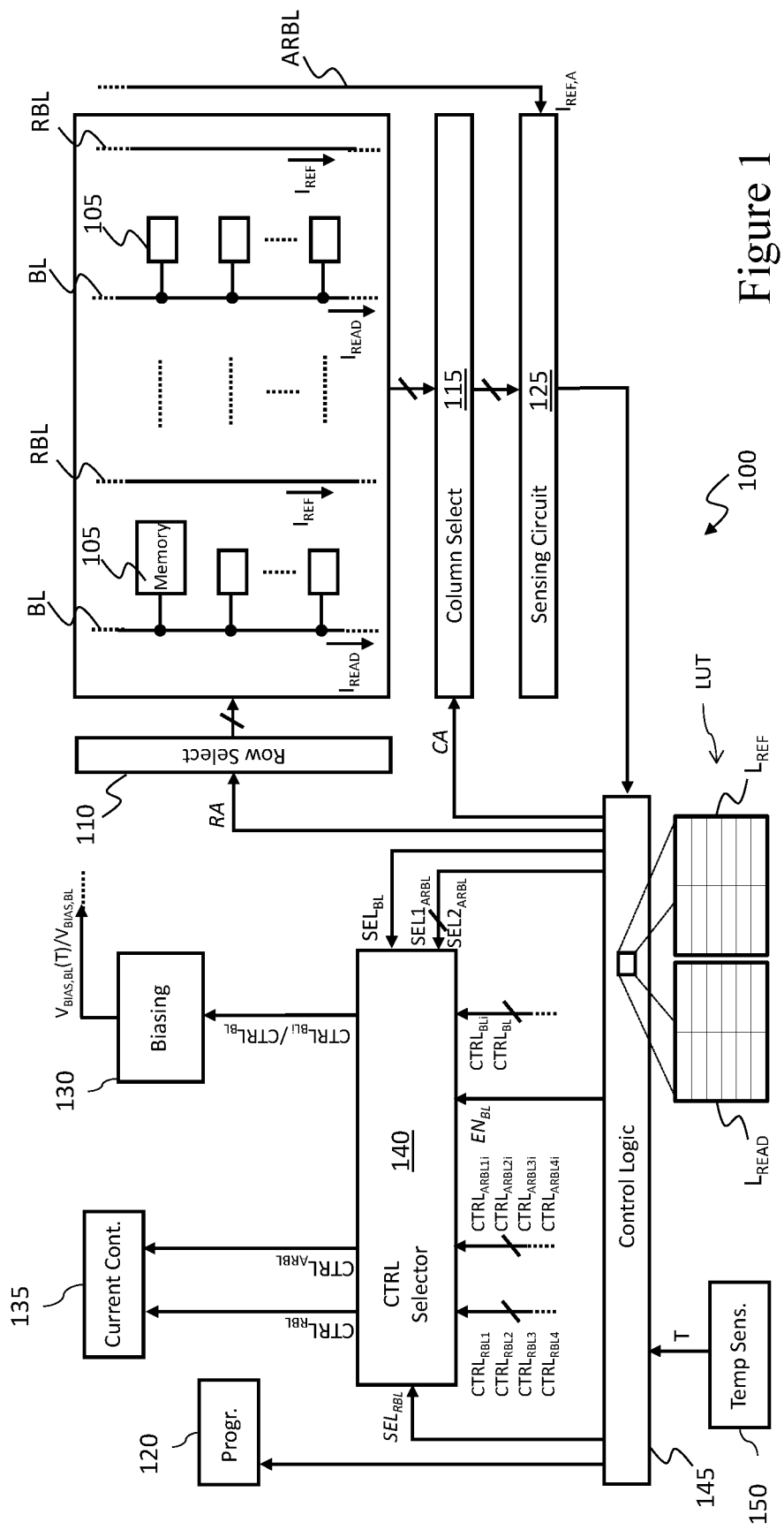
FIG. 1 shows a schematic circuit diagram of a memory device.

With reference to the drawings, FIG. 1 shows a schematic circuit diagram of a memory device 100.

In the following, when one or more features of the memory device 100 are introduced by the wording "according to an embodiment", they are to be construed as features additional or alternative to any features previously introduced, unless otherwise indicated and/or unless evident incompatibility among feature combinations.

In the following, only elements of (and operations performed by) the memory device 100 deemed relevant for the understanding of the embodiments will be shown and discussed, with other well-known elements of (and operations performed by) the memory device 100 that will be intentionally omitted for the sake of conciseness.

According to an embodiment, the memory device 100 comprises a plurality of programmable memory cells 105.

According to an embodiment, the memory cells 105 are programmable to store each one a logic state among a plurality of (i.e., two or more) logic states.

According to an embodiment, each memory cell 105 is programmable to store a logic state according to a respective programming electric current flowing through the memory cell 105.

According to an embodiment, the memory cells 105 comprise "Phase Change Memory" (PCM) memory cells. Broadly speaking, a PCM memory cell is configured to store data using phase change materials (such as chalcogenide) capable of stably transitioning between amorphous and crystalline phases according to an amount of heat transferred thereto (wherein the amount of heat is determined by the programming electric current applied to the memory cell). The amorphous and crystalline phases exhibit different resistance values, which are used to distinguish different logic states of the memory cells: particularly, the amorphous phase exhibits a relatively high resistance, and the crystalline phase exhibits a relatively low resistance.

According to an embodiment, the amorphous phase is used to represent a logic state "0" (usually referred to as RESET state), and the crystalline phase is used to represent a logic state "1" (usually referred to as SET state).

Although in the following explicit reference will be made to memory cells 105 capable of storing one bit per memory cell (two logic states, such as the SET and RESET states), the principles equivalently apply to memory cells capable of storing more than one bit per memory cell (more than two logic states). Just as an example, PCM memory cells may exploit partially-amorphous phases of the phase change material to set additional resistance values corresponding to additional logic states.

Examples of memory cells other than the PCM memory cells that may be used in the memory device 100 comprise, but are not limited to, "Spin Torque Magnetoresistive Random Access Memory Cells" (ST-MRAM) memory cells and "Resistive Random Access Memory Cells" (RRAM) memory cells.

According to an embodiment, the memory cells 105 are arranged in a matrix of rows (corresponding to a plurality of word lines, not shown) and columns (corresponding to a plurality of bit lines, discussed in the following), the memory cells 105 being, for example, arranged in the matrix at intersections between the bit lines and word lines.

According to an embodiment, the memory device 100 comprises a row selection circuit 110 for selecting one or more word lines among the plurality of word lines according to a row address RA, and a column selection circuit 115 for selecting one or more bit lines among the plurality of bit lines according to a column address CA, each pair of selected word line and bit line identifying a corresponding selected memory cell of the plurality of memory cells 105.

According to an embodiment, the memory device 100 comprises a programming circuit 120 for programming a selected memory cell of the plurality of memory cells to a desired or target logic state (e.g., the SET state or the RESET state).

According to an embodiment, the programming circuit 120 is configured to program the selected memory cell to the target logic state by applying to the selected memory cell a corresponding programming electric current (i.e., a programming electric current depending on the target logic state).

In the example herein considered in which the memory cells 105 comprise PCM memory cells, and the target logic state comprises the SET state or the RESET state, the programming electric current may comprise one or more (e.g., a succession of) programming current pulses for programming the selected memory cell to the SET state (hereinafter, SET programming current pulses) or a succession of programming current pulses for programming the selected memory cell to the RESET state (hereinafter, RESET programming current pulses).

According to an embodiment, the memory device 100 comprises a reading circuit for reading the logic state of the selected memory cell.

According to an embodiment, the reading circuit comprises, for each selected memory cell, a bit line BL through which a reading electric current $I_{READ}$ flows depending on the logic state of the selected memory cell, a reference bit line RBL through which a reference electric current $I_{REF}$ flows, and a sensing circuit 125 configured to sense the logic state of the selected memory cell according to the reading electric current $I_{READ}$ and the reference electric current $I_{REF}$ (e.g., according to a comparison between the reading electric current $I_{READ}$ and the reference electric current $I_{REF}$).

According to an embodiment, the memory device 100 comprises a biasing circuit 130. For the purposes of the present disclosure, as better discussed in the following, the biasing circuit 130 is configured provide the bit lines BL with a biasing electric voltage $V_{BIAS,BL}$ (the reading electric current $I_{READ}$ also depending on the biasing electric voltage $V_{BIAS,BL}$).

According to an embodiment, the memory device 100 is configured to implement, during a programming operation of a selected memory cell, a verify operation intended to verify a progress of the programming operation. According to verify operation principles, after a predetermined programming current pulse of the succession of programming current pulses is applied to the selected memory cell, the memory device 100 is configured to read, through the reading circuit, a current logic state of the selected memory cell. According to an embodiment, the predetermined programming current pulse comprises one or more, preferably both, between a first programming current pulse of the succession of programming current pulses and a last programming current pulse of the succession of programming current pulses.

According to an embodiment, in order to sense the current logic state of the selected memory cell during each verify operation, the memory device 100 is configured to set the reference electric current $I_{REF}$ at a value depending on the target logic state and on the corresponding predetermined programming current pulse (i.e., the predetermined programming current pulse after the application of which such verify operation is performed).

In the example herein considered in which the target logic state comprises the SET state or the RESET state, and in which the predetermined programming current pulse comprises the first and last programming current pulses, the value of the reference electric current $I_{REF}$ may be set at a value $I_{REFset,a}$ for the first SET programming current pulse of the succession of SET programming current pulses, at a value $I_{REFset,b}$ for the last SET programming current pulse of the succession of SET programming current pulses, at a value $I_{REFreset,a}$ for the first RESET programming current pulse of the succession of RESET programming current pulses, and at a value $I_{REFreset,b}$ for the last RESET programming current pulse of the succession of RESET programming current pulses.

According to an embodiment, each value $I_{REFset,a}$, $I_{REFset,b}$, $I_{REFreset,a}$, $I_{REFreset,b}$ of the reference electric current $I_{REF}$ is set at the reference bit line RBL according to a respective control signal $CTRL_{RBL1}$, $CTRL_{RBL2}$, $CTRL_{RBL3}$, $CTRL_{RBL4}$ configured to control a controllable element associated with the reference bit line RBL. According to an embodiment, the controllable element associated with the bit line RBL is a controllable element provided in a current control circuit 135 (as discussed in the following).

According to an embodiment, the memory device 100 comprises a control signal selector unit (hereinafter, CTRL selector unit) 140 for selecting the control signal among the plurality of control signals $CTRL_{RBL1}$, $CTRL_{RBL2}$, $CTRL_{RBL3}$, $CTRL_{RBL4}$ according to a value of a corresponding selection signal $SEL_{RBL}$ (in the following, such a selected control signal will be denoted by $CTRL_{RBL}$).

According to an embodiment, provision of the selection signal $SEL_{RBL}$ to the CTRL selector unit 140 is enabled and disabled upon start and end, respectively, of the verify operation.

According to an embodiment, the memory device 100 comprises a control logic unit 145 configured to control an overall operation of the memory device 100 in response to external commands (such as write/read commands) from an external source (not shown).

As conceptually represented in FIG. 1 by respective arrow connections, for the purposes of the present disclosure the control logic unit 145 is configured to provide the row RA and column CA addresses, to control the programming circuit 120, to provide the selection signal $SEL_{RBL}$, and to receive the logic state (or the current logic state) sensed by the sensing circuit 125.

The memory device so far disclosed may essentially be regarded as a typical, known memory device.

It is noted by those skilled in the art that such a known memory device, especially when the memory cells comprise PCM memory cells, exhibits criticalities during verify operations.

Indeed, the reading electric current $I_{READ}$ of a PCM memory cell exhibits variations with temperature, bit line voltage and time elapsed from the application of the predetermined programming current pulse and the start of the verify operation.

Since the verify operation has to be performed immediately after the application of the programming current pulse (i.e., the predetermined programming current pulse), so as to end the programming operation within a prescribed time, and since the sensing circuit 125 is typically designed to optimally discriminate the logic state of a memory cell only in a given electric current range, such a variability of the reading electric current $I_{READ}$ may result in non-negligible errors during the verify operation, and particularly in the failure to detect the logic state of the memory cell by the sensing circuit 125.

Particularly, it has been experimentally found that detection of the SET logic state may systematically fail at low temperatures and that the detection of the RESET logic state may systematically fail at high temperatures.

The memory device 100 according to embodiments is aimed at overcoming (or at least strongly reducing) such issues, as discussed here below.

According to the principles of the embodiments, the memory device 100 comprises a temperature sensor 150 for sensing a temperature of the memory device 100 (the temperature of the memory device 100 sensed and provided by the temperature sensor 150 being denoted by T), and an adjusting circuit for providing to the sensing circuit 125 one or more adjusted electric currents being adjusted according to the temperature of the memory device 100 (as better understood from the following discussion, the adjusted electric currents are aimed at compensating temperature drifts between the reading electric current $I_{READ}$ and the reference electric current $I_{REF}$), whereby the sensing circuit 125 is allowed to sense the current logic state of the selected memory cell according to the adjusted electric currents. Otherwise stated, the adjusting circuit is configured to adjust at least one between the reading electric current $I_{READ}$ and the reference electric current $I_{REF}$ to be provided to the sensing circuit 125 according to the temperature of the memory device 100.

According to an embodiment, the memory device 100 stores, within it, a dependency between the adjusted electric currents and the temperature of the memory device 100. According to an embodiment, the dependency between the adjusted electric currents and the temperature of the memory device 100 is determined during a characterization phase of the memory device 100.

According to an embodiment, the dependency between the adjusted electric currents and the temperature of the memory device 100 is stored in the memory device 100 in the form of one or more look up tables LUT including, for each i-th temperature range $TR_i$ of a plurality I of predefined temperature ranges $TR_i$ (i=1, 2, . . . I), an indication of the adjusted electric currents.

According to an embodiment, each predefined temperature range $TR_i$ ranges from a respective minimum temperature to a respective maximum temperature. According to an embodiment, a difference between the maximum and minimum temperatures of each predefined temperature range $TR_i$ may be from 10° C. to 60° C.

According to an embodiment, the difference between the maximum and minimum temperatures of each predefined temperature range $TR_i$ may depend on the number I of predefined temperature ranges $TR_i$.

According to an embodiment, the look up tables are stored in a proper memory location of the control logic unit 145 of the memory device 100.

According to an embodiment, which may also form an independent aspect of the present invention, the adjusted electric currents comprise an adjusted reading electric current being adjusted with respect to the reading electric current $I_{READ}$ according to the temperature of the memory device 100, whereby the sensing circuit 125 is configured to sense the current logic state of the selected memory cell according to a comparison between the adjusted reading electric current and the reference electric current $I_{REF}$.

According to an embodiment, the adjusted reading electric current is adjusted with respect to the reading electric current $I_{READ}$ based on an adjusted biasing electric voltage $V_{BIAS,BL}(T)$ being adjusted according to the temperature of the memory device 100 (in other words, in this embodiment the adjusted biasing electric voltage is used to adjust the reading electric current $I_{READ}$ thereby obtaining the adjusted reading electric current).

According to an embodiment, the memory device 100 is configured to set the adjusted biasing electric voltage at a value depending on the temperature of the memory device 100. According to an embodiment, the adjusted biasing electric voltage $V_{BIAS,BL}(T)$ may take a plurality I of values $V_{BIAS,BLi}$ each one associated with a respective i-th temperature range $TR_i$ within which the temperature of the memory device 100 falls: in the example at issue, the adjusted biasing electric voltage $V_{BIAS,BL}(T)$ may take a value $V_{BIAS,BL1}$ associated with the temperature range $TR_1$, a value $V_{BIAS,BL2}$ associated with the temperature range $TR_2$, a value $V_{BIAS,BL3}$ associated with the temperature range $TR_3$, a value $V_{BIAS,BL4}$ associated with the temperature range $TR_4$, a value $V_{BIAS,BL5}$ associated with the temperature range $TR_5$, and a value $V_{BIAS,BL6}$ associated with the temperature range $TR_6$. Just as an example, the plurality I of values $V_{BIAS,BLi}$ may define a succession of values in which each value differ from the adjacent value in the succession by a respective voltage gap of 100 mV to 1 V.

According to an embodiment, each value $V_{BIAS,BLi}$ of the adjusted biasing electric voltage $V_{BIAS,BL}(T)$ is set at the bit line BL according to a respective control signal $CTRL_{BLi}$ configured to control a controllable element associated with the bit line BL. According to an embodiment, the controllable element associated with the bit line BL is a controllable element provided in the biasing circuit 130.

According to an embodiment, the CTRL selector unit 140 is further configured to select the i-th control signal $CTRL_{BLi}$ among the plurality of control signals $CTRL_{BLi}$ ($CTRL_{BL1}$, $CTRL_{BL2}$, $CTRL_{BL3}$, $CTRL_{BL4}$, $CTRL_{BL5}$, $CTRL_{BL6}$, in the example at issue) according to a value of a corresponding selection signal $SEL_{BL}$.

According to alternative embodiments, not shown, the memory device 100 is configured to set the adjusted biasing electric voltage $V_{BIAS,BL}(T)$ at a value depending also on one or both between the target logic state and the predetermined programming current pulse.

According to an embodiment, the memory device 100 is configured to cause the biasing circuit 130 to bias the bit line BL with the adjusted biasing electric voltage $V_{BIAS,BL}(T)$ (i.e., with a selected value thereof) or with the predefined biasing electric voltage $V_{BIAS,BL}$. According to an embodiment, the predefined biasing electric voltage $V_{BIAS,BL}$ is set at the bit line BL (e.g., when no verify operation takes place) according to a respective control signal $CTRL_{BL}$ configured to control the controllable element associated with the bit line BL (as discussed in the following). According to an embodiment, the CTRL selector unit 140 is further configured to select between the i-th control signal $CTRL_{BLi}$ and the control signal $CTRL_{BL}$ according to a value of a corresponding enable signal $EN_{BL}$ (the selection between the i-th control signal $CTRL_{BLi}$ and the control signal $CTRL_{BL}$ being denoted in the figure by $CTRL_{BLi}/CTRL_{BL}$).

According to an embodiment, the enable signal $EN_{BL}$ is a digital signal (e.g., provided by the control logic unit 145) taking a first (e.g., low) logic level that allows the control signal $CTRL_{BL}$ to be fed to the biasing circuit 130, or a second (e.g., high) logic level that allows the selected i-th control signal $CTRL_{BLi}$ to be fed to the biasing circuit 130.

In alternative embodiments, not shown, the predefined biasing electric voltage $V_{BIAS,BL}$ may also correspond to one of the values $V_{BIAS,BLi}$ of the adjusted biasing electric voltage $V_{BIAS,BL}(T)$, in which case the enable signal $EN_{BL}$ may also be omitted.

According to an embodiment, the look up tables comprise a look up table $L_{READ}$ storing the dependency between the adjusted biasing electric voltage $V_{BIAS,BL}(T)$ and the temperature of the memory device 100.

According to an embodiment, the look up table $L_{READ}$ comprises, for each i-th temperature range $TR_i$, a respective value of the selection signal $SEL_{BL}$ (each one corresponding to a respective control signal $CTRL_{BLi}$ to be selected among the plurality of control signals $CTRL_{BL1}$, $CTRL_{BL2}$, $CTRL_{BL3}$, $CTRL_{BL4}$, $CTRL_{BL5}$, $CTRL_{BL6}$, and hence to a respective value of the adjusted biasing electric voltage $V_{BIAS,BL}(T)$). According to an embodiment, based on the temperature of the memory device 100 sensed by the temperature sensor 150, the control logic unit 145 is configured to set the selection signal $SEL_{BL}$ at the value that, in the look up table $L_{READ}$, is associated with the i-th temperature range $TR_i$ within which the sensed temperature falls.

Therefore, when considering embodiments in which the adjusted reading electric current is adjusted based on the adjusted biasing electric voltage $V_{BIAS,BL}(T)$, the adjusting circuit may be regarded as comprising the biasing circuit 130 (or a portion thereof), the CTRL selector circuit 140 (or a portion thereof), the look up table $L_{READ}$, and the control logic unit 145.

According to an embodiment, which may also form an independent aspect, the adjusted electric currents comprise an adjusted reference electric current being adjusted with respect to the reference electric current $I_{REF}$ according to the temperature of the memory device 100, whereby the sensing circuit 125 is configured to sense the current logic state of the selected memory cell according to a comparison between the reading electric current $I_{READ}$ and the adjusted reference electric current.

According to an embodiment, the reading circuit comprises a plurality of further or additional reference bit lines ARBL. According to an embodiment, each additional reference bit line ARBL is associated with a respective reference bit line RBL. According to an embodiment, the adjusting circuit is configured to provide each additional reference bit line ARBL with a further or additional reference electric current $I_{REF,A}$ depending on the temperature of the memory device 100, the adjusted reference electric current comprising the reference electric current $I_{REF}$ and the additional reference electric current $I_{REF,A}$.

According to an embodiment, in order to sense the current logic state of the selected memory cell during each verify operation, the adjusting circuit 100 is configured to set the additional reference electric current $I_{REF,A}$ at a value depending on the target logic state, on the predetermined programming current pulse (i.e., the predetermined programming current pulse after the application of which such verify operation is performed), and on the temperature of the memory device 100.

In the example herein considered in which the target logic state comprises the SET state or the RESET state, and in which the predetermined programming current pulse comprises the first and last programming current pulses, the value of the additional reference electric current $I_{REF,A}$ is set:

for the first SET programming current pulse of the succession of SET programming current pulses, at a value $I_{REFset,ai}$ when the temperature of the memory device 100 falls within the i-th temperature range $TR_i$. In the example at issue, the additional reference electric current $I_{REF,A}$ for the first SET programming current pulse may take a value $I_{REFset,a1}$ associated with the temperature range $TR_1$, a value $I_{REFset,a2}$ associated with the temperature range $TR_2$, a value $I_{REFset,a3}$ associated with the temperature range $TR_3$, a value $I_{REFset,a4}$ associated with the temperature range $TR_4$, a value $I_{REFset,a5}$ associated with the temperature range $TR_5$, and a value $I_{REFset,a6}$ associated with the temperature range $TR_6$. Just as an example, the plurality of values $I_{REFset,ai}$ (each one associated with a respective predefined temperature range $TR_i$) may define a succession of values in which each value differs from the adjacent value in the succession by a respective current gap of 1 µA to 10 µA.

for the last SET programming current pulse of the succession of SET programming current pulses, at a value $I_{REFset,bi}$ when the temperature of the memory device

100 falls within the i-th temperature range $TR_i$. In the example at issue, the additional reference electric current $I_{REF,A}$ for the last SET programming current pulse may take a value $I_{REFset,b1}$ associated with the temperature range $TR_1$, a value $I_{REFset,b2}$ associated with the temperature range $TR_2$, a value $I_{REFset,b3}$ associated with the temperature range $TR_3$, a value $I_{REFset,b4}$ associated with the temperature range $TR_4$, a value $I_{REFset,b5}$ associated with the temperature range $TR_5$, and a value $I_{REFset,b6}$ associated with the temperature range $TR_6$. Just as an example, the plurality of values $I_{REFset,bi}$ (each one associated with a respective predefined temperature range $TR_i$) may define a succession of values in which each value differs from the adjacent value in the succession by a respective current gap of 1 µA to 10 µA;

for the first RESET programming current pulse of the succession of RESET programming current pulses, at a value $I_{REFreset,ai}$ when the temperature of the memory device 100 falls within the i-th temperature range $TR_i$. In the example at issue, the additional reference electric current $I_{REF,A}$ for the first RESET programming current pulse may take a value $I_{REFreset,a1}$ associated with the temperature range $TR_1$, a value $I_{REFreset,a2}$ associated with the temperature range $TR_2$, a value $I_{REFreset,a3}$ associated with the temperature range $TR_3$, a value $I_{REFreset,a4}$ associated with the temperature range $TR_4$, a value $I_{REFreset,a5}$ associated with the temperature range $TR_5$, and a value $I_{REFreset,a6}$ associated with the temperature range $TR_6$. Just as an example, the plurality of values $I_{REFreset,ai}$ (each one associated with a respective predefined temperature range $TR_i$) may define a succession of values in which each value differs from the adjacent value in the succession by a respective current gap of 1 µA to 10 µA; and for the last RESET programming current pulse of the succession of RESET programming current pulses, at a value $I_{REFreset,bi}$ when the temperature of the memory device 100 falls within the i-th temperature range $TR_i$. In the example at issue, the additional reference electric current $I_{REF,A}$ for the last RESET programming current pulse may take a value $I_{REFreset,b1}$ associated with the temperature range $TR_1$, a value $I_{REFreset,b2}$ associated with the temperature range $TR_2$, a value $I_{REFreset,b3}$ associated with the temperature range $TR_3$, a value $I_{REFreset,b4}$ associated with the temperature range $TR_4$, a value $I_{REFreset,b5}$ associated with the temperature range $TR_5$, and a value $I_{REFreset,b6}$ associated with the temperature range $TR_6$. Just as an example, the plurality of values $I_{REFreset,bi}$ (each one associated with a respective predefined temperature range $TR_i$) may define a succession of values in which each value differs from the adjacent value in the succession by a respective current gap of 1 µA to 10 µA.

According to an embodiment, each value $I_{REFset,ai}$, $I_{REFset,bi}$, $I_{REFreset,ai}$, $I_{REFreset,bi}$ of the reference electric current $I_{REF}$ is set at the additional reference bit line ARBL according to a respective control signal $CTRL_{ARBL1i}$, $CTRL_{ARBL2i}$, $CTRL_{ARBL3i}$, $CTRL_{ARBL4i}$ configured to control a controllable element associated with the additional reference bit line ARBL. According to an embodiment, the controllable element associated with the additional reference bit line RBL is a controllable element provided in the current control circuit 135 (as discussed in the following).

According to an embodiment, the CTRL selector unit 140 is configured to select the control signal among the plurality of control signals $CTRL_{ARBL1i}$, $CTRL_{ARBL2i}$, $CTRL_{ARBL3i}$, $CTRL_{ARBL4i}$ according to a value of one or more corresponding selection signal (in the following, such a selected control signal will be denoted by $CTRL_{ARBL}$). According to an embodiment, the CTRL selector unit 140 is configured to select the control signal among the plurality of control signals $CTRL_{ARBL1i}$, $CTRL_{ARBL2i}$, $CTRL_{ARBL3i}$, $CTRL_{ARBL4i}$ according to values of corresponding selection signals $SEL1_{ARBL}$, $SEL2_{ARBL}$ (as better discussed in the following, according to embodiments of the present invention, the selection signal $SEL1_{ARBL}$ allows selecting the control signals associated with a respective temperature range $TR_i$, whereas the selection signal $SEL2_{ARBL}$ allows selecting, among the control signals associated with a same temperature range $TR_i$, the control signal associated with the SET programming current pulse or the RESET programming current pulse).

According to an embodiment, the look up tables comprise a look up table $L_{REF}$ for storing the dependency between the adjusted reference electric current and the temperature of the memory device 100. According to an embodiment, the look up table $L_{REF}$ is configured to store the dependency between the additional reference electric current $I_{REF,A}$ and the temperature of the memory device 100.

According to an embodiment, the look up table $L_{REF}$ comprises, for each i-th temperature range $TR_i$, a respective value of the selection signals $SEL1_{ARBL}$, $SEL2_{ARBL}$ (each one corresponding to a respective control signal $CTRL_{ARBL}$ to be selected among the plurality of control signals $CTRL_{ARBL1i}$, $CTRL_{ARBL2i}$, $CTRL_{ARBL3i}$, $CTRL_{ARBL4i}$, and hence to a respective value of the additional electric reference current $I_{REF,A}$. According to an embodiment, based on the temperature of the memory device 100 sensed by the temperature sensor 150, the control logic unit 145 is configured to set the selection signal $SEL1_{ARBL}$ at the value that, in the look up table $L_{REF}$, is associated with the i-th temperature range $TR_i$ within which the sensed temperature falls, and to set the selection signal $SEL2_{ARBL}$ at the value that, in the look up table $L_{REF}$, is associated with the considered predetermined programming current pulse (i.e., the SET programming current pulse or the RESET programming current pulse).

Figure 2:
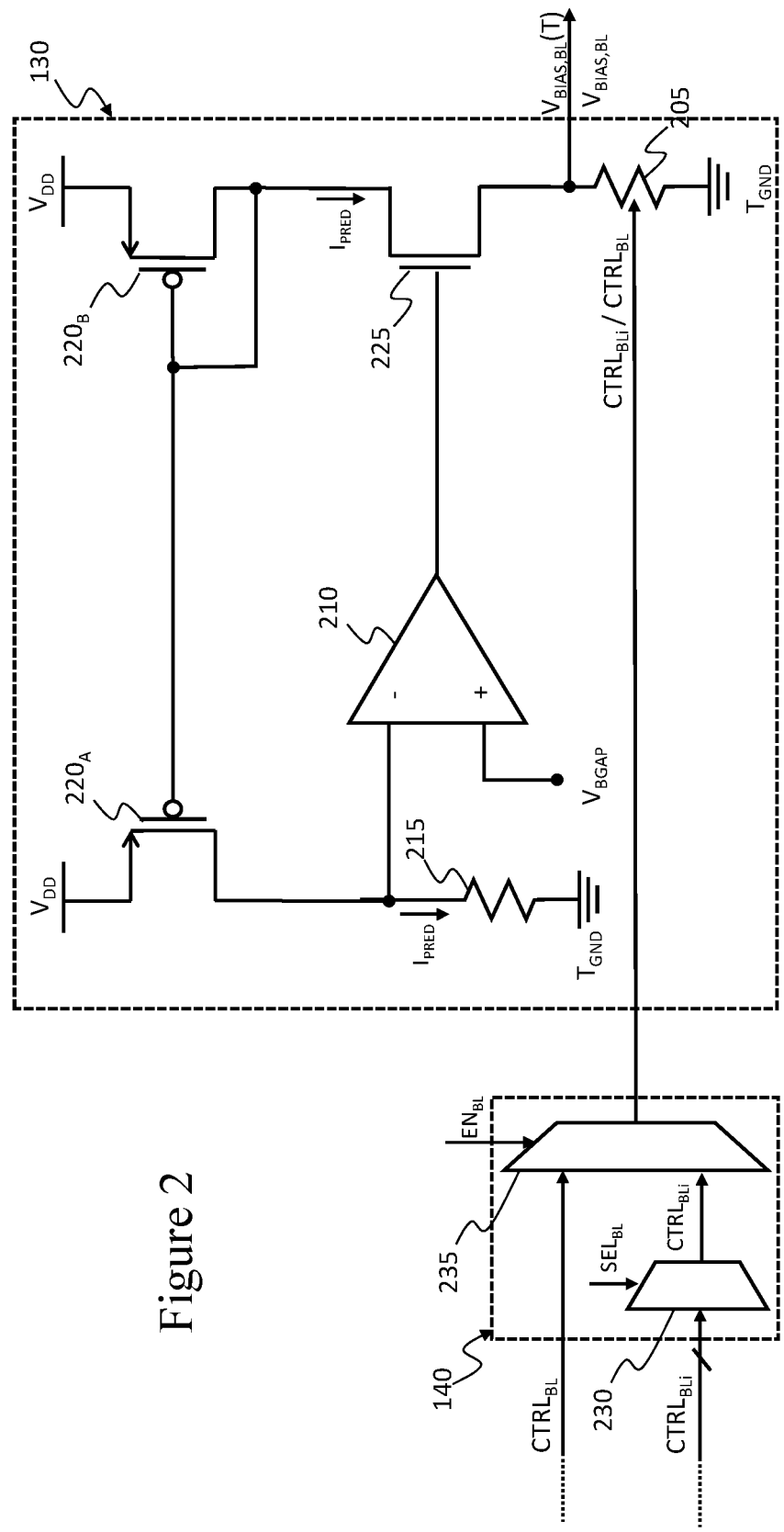
FIG. 2 shows a schematic circuit diagram of an adjusting circuit of said memory device.
Figure 3:
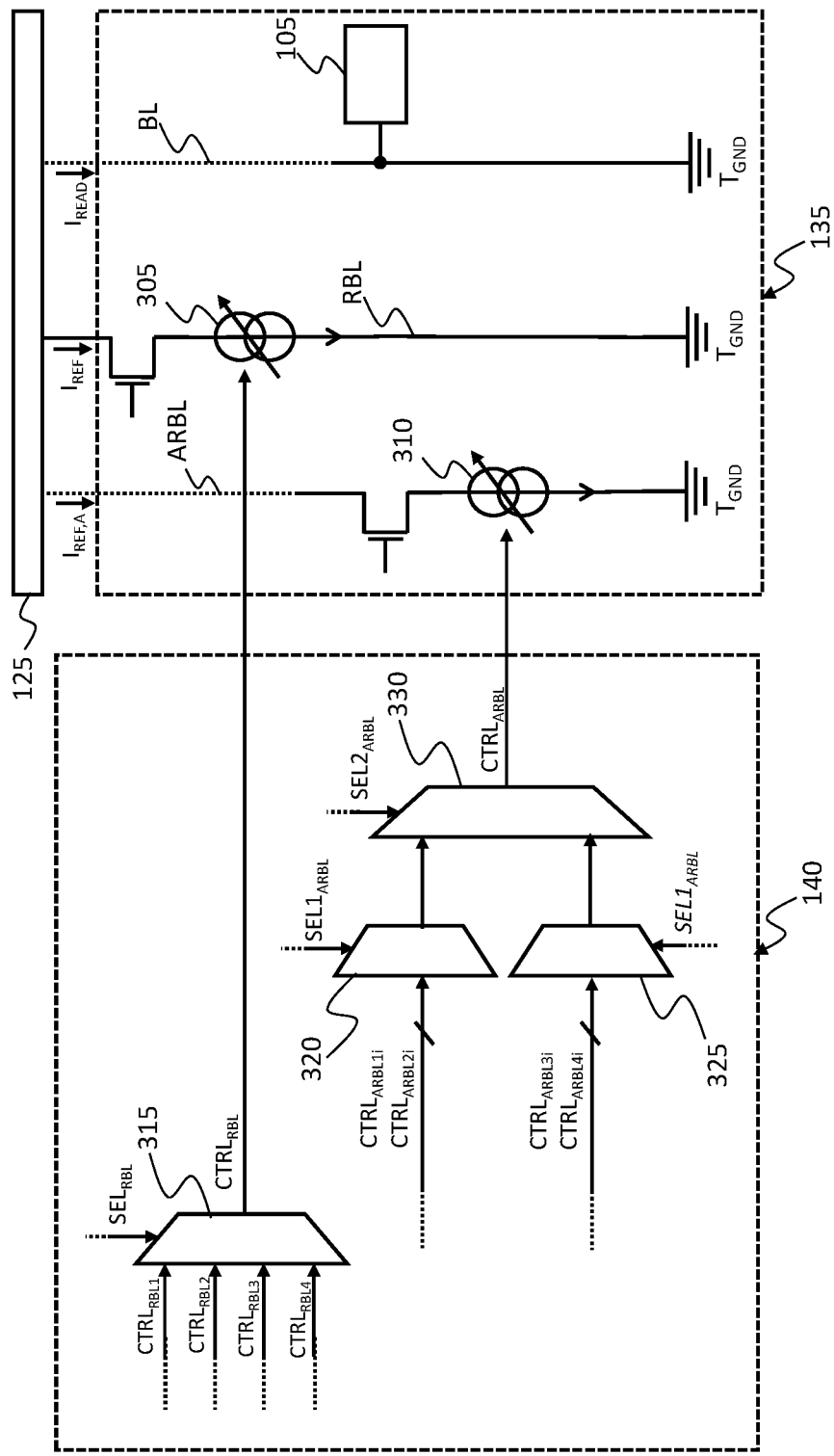
FIG. 3 shows a schematic circuit diagram of an adjusting circuit of said memory device.

According to an embodiment, which may also form an independent aspect, the adjusted electric currents comprise both the adjusted reading electric current and the adjusted reference electric current, whereby the sensing circuit 125 is configured to sense the current logic state of the selected memory cell according to a comparison between the adjusted reading electric current and the adjusted reference electric current: as should be understood, in this embodiment, the implementations of the adjusting circuit discussed in the following with reference to FIGS. 2 and 3 may coexist.

With reference to FIG. 2, a schematic circuit diagram of an adjusting circuit is shown, according to an embodiment, wherein the adjusted reading electric current is adjusted based on the adjusted biasing electric voltage $V_{BIAS,BL}(T)$.

As mentioned above, the adjusting circuit comprises a portion of the biasing circuit 130 and a portion of the CTRL selector circuit 140.

As mentioned above, the biasing circuit 130 is configured to bias the bit line BL with the adjusted biasing electric voltage $V_{BIAS,BL}(T)$ (i.e., with a selected value thereof) or with the predefined biasing electric voltage $V_{BIAS,BL}$ according to, respectively, the control signal $CTRL_{BLi}$ or the control signal $CTRL_{BL}$ (hereinafter, control signal $CTRL_{BLi}/CTRL_{BL}$). According to an embodiment, the biasing circuit 130 comprises a variable resistor 205 (or other controllable element) configured to be controlled by the control signal $CTRL_{BLi}/CTRL_{BL}$. According to an embodiment, when the variable resistor 205 (or other controllable element) is controlled by the control signal $CTRL_{BLi}$, the resistance value of the variable resistor 205 is adjusted according to the temperature of the memory device 100 (whereby the bit line BL is set at a corresponding value $V_{BIAS,BLi}$ of the adjusted biasing electric voltage $V_{BIAS,BL}(T)$, as discussed here below). According to an embodiment, when the variable resistor 205 (or other controllable element) is controlled by the control signal $CTRL_{BL}$, the resistance value of the variable resistor 205 is accordingly adjusted to set the bit line BL at the predefined biasing electric voltage $V_{BIAS,BL}$.

According to an embodiment, the biasing circuit 130 comprises a circuit arrangement configured to cause a predefined electric current $I_{PRED}$ (or a scaled version thereof) to flow through the variable resistor 205, the value of the adjusted biasing electric voltage $V_{BIAS,BL}(T)$ (and similarly, the value of the predefined biasing electric voltage $V_{BIAS,BL}$) thus depending on the adjusted resistance value of the variable resistor 205 and on the predefined electric current $I_{PRED}$ flowing therethrough.

According to an embodiment, the circuit arrangement is configured to generate the predefined electric current $I_{PRED}$ according to a reference voltage $V_{BGAP}$. According to an embodiment, the reference voltage $V_{BGAP}$ comprises a bandgap reference voltage, i.e. a reference voltage that is stable over supply voltage changes and/or over temperature changes. According to an embodiment, the bandgap voltage $V_{BGAP}$ is generated by a proper bandgap generator circuit (not shown) communicably coupled to the biasing circuit 130.

According to an embodiment, the circuit arrangement comprises an operational amplifier 210 having a non-inverting input terminal (denoted by "+" in the figure) for receiving the reference voltage $V_{BGAP}$, an inverting input terminal (denoted by "−" in the figure), and an output terminal electrically coupled to the inverting input terminal in negative feedback configuration (as better discussed here below), and a reference resistor 215 having a first terminal electrically coupled (e.g., directly connected) to the inverting input terminal of the operational amplifier 210 and a second terminal electrically coupled (e.g., directly connected) to a reference terminal $T_{GND}$ providing a reference voltage with respect to a supply voltage VDD (e.g., a ground or 0 V voltage). According to well-known principles of operational amplifiers, the value of predefined electric current $I_{PRED}$ depends on the value of the reference voltage $V_{BGAP}$ and on the resistance value of the reference resistor 215.

According to an embodiment, the circuit arrangement comprises a current mirroring circuit configured to mirror (e.g. copy) the predefined electric current $I_{PRED}$ to the variable resistor 205.

According to an embodiment, the current mirroring circuit comprises a conventional current mirror.

According to an embodiment, the current mirror comprises a first transistor $220_A$ (e.g., a PMOS transistor) having a source terminal receiving the supply voltage VDD, a drain terminal electrically coupled (e.g., directly connected) to the first terminal of the reference resistor 215 (and, hence, to the inverting input terminal of the operational amplifier 210), and a gate terminal, and a second transistor $220_B$ (e.g., a PMOS transistor) in diode-connected configuration, i.e., having a source terminal receiving the supply voltage VDD, a gate terminal electrically coupled (e.g., directly connected) to the gate terminal of the first transistor $220_A$ and a drain terminal, electrically connected to the gate terminal, providing a copy of the predefined electric current $I_{PRED}$ (or a scaled version thereof, in alternative embodiments of the present invention).

According to an embodiment, the drain terminal of the second transistor $220_B$ is electrically coupled to a first terminal of the variable resistor 205 (a second terminal of the variable resistor 205 being, for example, electrically coupled (e.g., directly connected) to the ground terminal $T_{GND}$), whereby the adjusted resistance value of the variable resistor 205, which is adjusted according to the control signal $CTRL_{BL}$, (or to the control signal $CTRL_{BL}$), and the predefined electric current $I_{PRED}$ flowing through the variable resistor 205 define, across the variable resistor 205 (and, particularly, at the first terminal thereof), the corresponding value $V_{BIAS,BLi}$ of the adjusted biasing electric voltage $V_{BIAS,BL}(T)$ (or, respectively, the predefined biasing electric voltage $V_{BIAS,BL}$).

According to an embodiment, the drain terminal of the second transistor $220_B$ is electrically coupled to the first terminal of the variable resistor 205 by interposition of a regulator transistor 225. According to an embodiment, the regulator transistor 225 comprises an NMOS transistor having a gate terminal electrically coupled (e.g., directly connected) to the output terminal of the operational amplifier 210, a drain terminal electrically coupled (e.g., directly connected) to the drain terminal of the second transistor $220_B$, and a source terminal electrically coupled (e.g., directly connected) to the first terminal of the variable resistor 205. According to an embodiment, not shown, the regulator transistor 225 may comprise a plurality of series-connected regulator transistors. According to an embodiment, the plurality of series-connected regulator transistors is designed and sized to reflect an impedance of the column selector circuit 115 (e.g., so as to supply the column selector unit 115 with a regulated and stable voltage at the output of the operational amplifier 210).

According to an embodiment, the CTRL selector circuit 140 comprises a selector element (e.g., a multiplexer) 230 configured to receive, at inputs thereof, the plurality I of control signals $CTRL_{BLi}$, and to provide, at an output thereof, the selected i-th control signal $CTRL_{BL}$, being selected according to the selection signal $SEL_{BL}$.

According to an embodiment, the CTRL selector circuit 140 comprises a selector element (e.g., a multiplexer) 235 configured to receive, at inputs thereof, the selected i-th control signal $CTRL_{BLi}$ and the control signal $CTRL_{BL}$, and to provide, at an output thereof, the selected i-th control signal $CTRL_{BLi}$ or the control signal $CTRL_{BL}$ according to the value of the enable signal $EN_{BL}$.

With reference to FIG. 3, a schematic circuit diagram of an adjusting circuit is shown, according to an embodiment, wherein the adjusted electric currents comprise an adjusted reference electric current being adjusted with respect to the reference electric current $I_{REF}$ according to the temperature of the memory device 100.

As mentioned above, the adjusting circuit comprises a portion of the current control circuit 135 and a portion of the CTRL selector circuit 140.

According to an embodiment, the current control circuit 135 comprises, e.g., associated with the reference bit line RBL, a current generator 305 (e.g., a voltage controlled current generator), or other controllable element, configured to generate the reference electric current $I_{REF}$ according to the control signal $CTRL_{RBL}$.

According to an embodiment, the current control circuit 135 comprises, e.g., associated with the additional reference bit line ARBL, a current generator 310 (e.g., a voltage controlled current generator), or other controllable element, configured to generate the additional reference electric current $I_{REF,A}$ according to the control signal $CTRL_{ARBL}$.

According to an embodiment, the CTRL selector circuit 140 comprises a selector element (e.g., a multiplexer) 315 configured to receive, at inputs thereof, the plurality of control signals $CTRL_{RBL1}$, $CTRL_{RBL2}$, $CTRL_{RBL3}$, $CTRL_{RBL4}$, and to provide, at an output thereof, a selected one of the plurality of control signals $CTRL_{RBL1}$, $CTRL_{RBL2}$, $CTRL_{RBL3}$, $CTRL_{RBL4}$ according to a value of the corresponding selection signal $SEL_{RBL}$.

According to an embodiment, the CTRL selector circuit 140 comprises a selector element (e.g., a multiplexer) 320 configured to receive, at inputs thereof, the plurality of control signals $CTRL_{ARBL1i}$, $CTRL_{ARBL2i}$ corresponding to the plurality of values of the additional reference electric current $I_{REF,A}$ associated with the first and last SET programming current pulses, and to provide, at an output thereof, a selected one of the plurality of control signals $CTRL_{ARBL1i}$, $CTRL_{ARBL2i}$ being selected according to the selection signal $SEL1_{ARBL}$.

According to an embodiment, the CTRL selector circuit 140 comprises a selector element (e.g., a multiplexer) 325 configured to receive, at inputs thereof, the plurality of control signals $CTRL_{ARBL3i}$, $CTRL_{ARBL4i}$ corresponding to the plurality of values of the additional reference electric current $I_{REF,A}$ associated with the first and last RESET programming current pulses, and to provide, at an output thereof, a selected one of the plurality of control signals $CTRL_{ARBL3i}$, $CTRL_{ARBL4i}$ being selected according to the selection signal $SEL1_{ARBL}$.

In other words, the multiplexers 320, 325 and the selection signal $SEL1_{ARBL}$ allow selecting two control signals associated with a same temperature range $TR_i$, with a same predetermined programming current pulse (i.e., the first programming current pulse or the last programming current pulse), and with opposite logic states (i.e., the SET state or the RESET state): just as an example, the control signal at the output of the multiplexer 320 may comprise the control signal $CTRL_{ARBL16}$, corresponding to the value $I_{REFset,a6}$ (SET state, temperature range $TR_6$), and the control signal at the output of the multiplexer 325 may comprise the control signal $CTRL_{ARBL36}$, corresponding to the value $I_{REFreset,a6}$ (RESET state, temperature range $TR_6$).

According to an embodiment, the CTRL selector circuit 140 comprises a selector element (e.g., a multiplexer) 330 configured to receive, at inputs thereof, the control signals from the multiplexers 320, 325, and to provide, at an output thereof, a selected one thereof according to the selection signal $SEL2_{ARBL}$.

In other words, the multiplexer 330 and the selection signal $SEL2_{ARBL}$ allow selecting, among the control signals associated with opposite logic states, the control signal associated with the target logic state (i.e., the SET state or the RESET state).

Thanks to the embodiments, temperature drifts between the reading electric current $I_{READ}$ and the reference electric current $I_{REF}$ are compensated, and moved to the electric current range within which the sensing circuit 125 is designed to optimally discriminate the current logic state of the memory cell. Thus, the sensing circuit 125 is allowed to correctly sense the current logic state of the selected memory cell, and hence to correctly perform the verify operations. In this way, the verify operations may be correctly performed immediately after the application of the predetermined programming current pulses, which allows meeting the requirements about the prescribed time within which the programming operation has to be ended.

Referring now to FIG. 4, a simplified block diagram of an electronic system 400 (i.e., a portion thereof) it shown comprising the memory device 100 (or more thereof) according to an embodiment.

According to an embodiment, the electronic system 400 is suitable for use in electronic devices such as handheld computers (PDAs, "Personal Digital Assistants"), laptop or portable computers, and mobile phones (for example, smartphones).

According to an embodiment, the electronic system 400 comprises a controller 405 (for example, one or more microprocessors and/or one or more microcontrollers).

According to an embodiment, the electronic system 400 comprises an input/output device 410 (for example, a keyboard and/or a screen). The input/output device 410 may for example be used to generate and/or receive messages. The input/output device 410 may for example be configured to receive/supply a digital signal and/or an analog signal.

According to an embodiment, the electronic system 400 comprises a wireless interface 415 for exchanging messages with a wireless communication network (not shown), for example by means of radio frequency signals. Examples of a wireless interface may include antennas and wireless transceivers.

According to an embodiment, the electronic system 400 comprises a power supply device (for example, a battery 420) for powering the electronic system 400.

According to an embodiment, the electronic system 400 comprises one more communication channels (bus) 425 to allow the exchange of data between the memory device 100, the controller 405 (when provided), the input/output device 410 (when provided), the wireless interface 415 (when provided), and the power supply device 420 (when provided).

Naturally, in order to satisfy local and specific requirements, a person skilled in the art may apply to the embodiments described above many logical and/or physical modifications and alterations. More specifically, although the embodiments have been described with a certain degree of particularity, it should be understood that various omissions, substitutions and changes in the form and details as well as other embodiments are possible. In particular, different embodiments may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment may be incorporated in any other embodiment.

In particular, similar considerations apply if the memory device has a different structure or includes equivalent components. In any case, any component thereof may be separated into several elements, or two or more components may be combined into a single element; furthermore, each component can be replicated to support the execution of the corresponding operations in parallel. It should also be noted that (unless otherwise indicated) any interaction between different components generally does not need to be continuous, and may be either direct or indirect through one or more intermediaries.

The invention claimed is:

1. A memory device, comprising:
a plurality of programmable memory cells;
a programming circuit for programming a selected memory cell of the plurality of memory cells to a target logic state by applying one or more programming current pulses to the selected memory cell;
a temperature sensor for sensing a temperature of the memory device;
a reading circuit for reading a current logic state of the selected memory cell after a predetermined programming current pulse of the programming current pulses, the reading circuit comprising:
a bit line coupled to the selected memory cell;
a reference bit line associated with said bit line;
a further reference bit line associated with both the reference bit line and said bit line;
a sensing circuit configured to sense a current logic state of the selected memory cell according to a comparison between a reading electric current on said bit line which is dependent on the current logic state of the selected memory cell and a reference electric current on said reference bit line;
wherein the sensing circuit senses the current logic state dependent on both said reference electric current and said further reference electric current; and
an adjusting circuit configured to adjust both the reference electric current and the reading electric current according to the sensed temperature of the memory device;
wherein the adjusting circuit is further configured to adjust a further reference electric current on the further reference bit line depending on both the sensed temperature of the memory device and a logic state to be programmed into the selected memory cell by the predetermined programming current pulse.

2. The memory device according to claim 1, wherein the adjusting circuit is configured to select the further reference electric current among a plurality of further reference currents, wherein each further reference electric current is associated with a respective temperature range, the adjusting circuit being configured to provide the further reference electric current associated with a temperature range within which the sensed temperature of the memory device falls.

3. The memory device according to claim 2, wherein the sensing circuit is configured to sense the current logic state of the selected memory cell according to a comparison between the selected further reference electric current and the reading electric current.

4. The memory device according to claim 1, wherein the predetermined programming current pulse comprises at least one between a first programming current pulse of the programming current pulses and a last programming current pulse of the programming current pulses.

5. The memory device according to claim 1, wherein the memory cells comprise one of phase-change memory cells, spin torque magnetoresistive random access memory cells, or resistive random-access memory cells.

6. The memory device according to claim 1, wherein the reading circuit comprises a bit line through which the reading electric current flows, and wherein the adjusting circuit is configured to bias the bit line with an adjusted biasing electric voltage being adjusted with respect to a predefined biasing electric voltage according to the sensed temperature of the memory device, the reading electric current being adjusted according to said adjusted biasing electric voltage.

7. The memory device according to claim 6, wherein the adjusting circuit comprises a variable resistor and a circuit arrangement configured to cause a predefined electric current to flow through the variable resistor, the predefined biasing electric voltage depending on a predefined resistance value of the variable resistor and on the predefined electric current flowing therethrough, the adjusting circuit being configured to adjust the resistance value of the variable resistor according to the temperature of the memory device, the adjusted biasing electric voltage depending on the adjusted resistance value of the variable resistor and on the predefined electric current flowing therethrough.

8. A memory device, comprising:
a plurality of programmable memory cells;
a programming circuit for programming a selected memory cell of the plurality of memory cells to a target logic state by applying one or more programming current pulses to the selected memory cell;
a temperature sensor for sensing a temperature of the memory device;
a reading circuit for reading a current logic state of the selected memory cell after a predetermined programming current pulse of the programming current pulses, the reading circuit comprising:
a bit line coupled to the selected memory cell;
a reference bit line associated with said bit line;
a further reference bit line associated with both the reference bit line and said bit line;
a sensing circuit configured to sense a current logic state of the selected memory cell according to a comparison between a reading electric current on said bit line which is dependent on the current logic state of the selected memory cell and both an adjusted reference electric current provided by a first reference electric current on the reference bit line and a second reference electric current on the further reference bit line; and
an adjusting circuit configured to adjust the first reference electric current to be provided to the sensing circuit according to the sensed temperature of the memory device and to adjust the second reference electric current to be provided to the sensing circuit according to both the sensed temperature of the memory device and a logic state to be programmed into the selected memory cell by the predetermined programming current pulse.

9. The memory device according to claim 8, wherein the adjusting circuit is configured to select the second reference electric current from among a plurality of further reference electric currents, wherein each further reference current is associated with a respective temperature range, the adjusting circuit being configured to provide the further reference electric current associated with a temperature range within which the sensed temperature of the memory device falls.

10. The memory device according to claim 9, wherein the predetermined programming current pulse comprises at least one between a first programming current pulse of the programming current pulses and a last programming current pulse of the programming current pulses.

11. The memory device according to claim 9, wherein the memory cells comprise one of phase-change memory cells, spin torque magnetoresistive random access memory cells, or resistive random-access memory cells.

* * * * *